United States Patent

Wisard et al.

[11] Patent Number: 5,795,628
[45] Date of Patent: Aug. 18, 1998

[54] DEVICE FOR COATING A SUBSTRATE SURFACE

[75] Inventors: André Wisard, Adlikon, Switzerland; Wolfgang Lohwasser, Gailingen, Germany

[73] Assignee: Alusuisse Technology & Management Ltd., Switzerland

[21] Appl. No.: 808,121

[22] Filed: Feb. 28, 1997

[30] Foreign Application Priority Data

Mar. 6, 1996 [EP] European Pat. Off. ............ 96810130

[51] Int. Cl.$^6$ .................................................. C23C 14/00
[52] U.S. Cl. .................. 427/566; 427/596; 427/248.1; 118/726
[58] Field of Search ..................... 118/726; 427/566, 427/596, 248.1

[56] References Cited

U.S. PATENT DOCUMENTS 3,552,352  1/1971  McConnell .

OTHER PUBLICATIONS

Patent Abstracts of Japan, vol. 95, No. 006, Jul. 31, 1995 & Japanese Publication No. 7074101, published Mar. 17, 1995.
Patent Abstracts of Japan, vol. 95, No. 005, Jun. 30, 1995 & Japanese Publication No. 7034231, published Feb. 3, 1995.

*Primary Examiner*—Richard Bueker
*Attorney, Agent, or Firm*—Bachman & LaPointe, P.C.

[57] ABSTRACT

Device containing a vacuum chamber 30 and situated therein a substrate 10 and a vaporization crucible 22 filled with inorganic materials 24. Situated in the region of the vacuum chamber 30 is an electron beam or laser gun 26, the electron or laser beam 27 of which is directed at the crucible 22. The device is employed for coating a substrate surface 18 e.g. a plastic film with a thin coating of inorganic materials, such as e.g. silicon oxides, by vapor deposition of the inorganic materials 24.

The electron or laser beam 27 of the electron beam or laser gun 26 is directed at the surface of the inorganic materials 24 in the vaporizing crucible 22. The electron or laser beam 27 forms an angle $\alpha$ of 10° to 80° to the surface of the inorganic materials 24. On vaporizing the inorganic materials 24 an overhang 25 is formed in the inorganic materials 24 and, geometrically, there is no line of sight between the vaporizing inorganic materials and the substrate surface 18.

The process performed in the device leads to substrates e.g. plastic films the surfaces of which exhibit no inhomogeneities such as sprayed material, particles or droplets of inorganic materials.

15 Claims, 2 Drawing Sheets

DEVICE FOR COATING A SUBSTRATE SURFACE

BACKGROUND OF THE INVENTION

The present invention relates to a device containing a vacuum chamber and situated therein a substrate and a vaporization crucible filled with inorganic materials and, in the region of the vacuum chamber, an electron beam or laser gun whose beam is directed at the crucible, said device being for coating a substrate surface with a coating of inorganic materials by vaporizing the inorganic materials.

Known e.g. from the patent document CH-A 683 776 is a process for coating a substrate surface with a permeability barrier layer of inorganic material which is vapor deposited onto the substrate surface in a vacuum chamber evacuated to a level of at least $10^{-3}$ mbar.

Thermal vaporization is the most used method for manufacturing optical coatings. For example, on coating a substrate surface in the form of packaging films, it has been found that such film material exhibits inhomogenieties to a greater or lesser extent. These inhomogenieties may be called sprayed material. It has been found that on vaporizing or sublimating the contents of the crucible under the action e.g. of the electron beam, very small amounts of the crucible contents do not enter the gas phase but, instead,—as a result of delayed boiling or similar local energy concentrations,—are sprayed in the solid or liquid state as fine particles or droplets and are sometimes ejected into the vacuum chamber and onto the substrate. On the substrate to be coated, these particles or droplets become defective regions; they may even cause damage, none of which can be tolerated on the substrate. This applies especially when plastic films for packaging purposes have to be coated with inorganic material.

SUMMARY OF THE INVENTION

The object of the present invention is to propose a device along with a process which makes it possible to produce extensively homogeneous, defect free coatings and coatings with no damage to the substrate.

That objective is achieved bay way of the invention in that the electron or laser beam of the electron beam or laser gun is directed at the surface of the inorganic materials in the vaporizing crucible, and the electron or laser beam forms an angle α of 10° to 80° to the surface of the inorganic materials, whereby on vaporizing the inorganic materials an overhang is formed in the inorganic materials and, geometrically, there is no line of sight between the vaporizing inorganic materials and the substrate surface.

If the substrate is a plastic film, the inorganic compounds deposited on the substrate act as effective barriers e.g. against gases, vapors or enclosed aromatic substances.

The inorganic materials in the crucible are preferably vaporized by applying an electron beam or laser beam from a scanning high-voltage electron gun or a laser gun. By "scanned" here is meant that the electron beam or laser beam tracks, programmed controlled, back and forward across the inorganic material to be vaporized. The electron beam or laser beam is thereby advantageously moved sideways with respect to the crucible. The voltage applied e.g. to an electron beam gun e.g. a high-voltage electron beam gun is preferably at least 5 kV, in particular at least 10 kV, at a current level of e.g. 0.5 to 10 A. The high voltage electron beam gun operates e.g. at a voltage of 35 kV.

An anode may be provided in the vacuum chamber to conduct away the electrostatic charge which builds up there. The anode may be formed by the vacuum chamber or parts of the crucible, or by another suitable surface e.g. a tube, sheet, section, mesh or wire. The anodes may also be heated to temperatures which are higher than the vaporization temperatures of the vaporized materials. If the wall of the vacuum chamber is insulated from the anode, the voltage of the anode may be raised by an additional voltage source, preferably of 20 to 300 V; this leads to a higher potential difference between the plasma and the substrate and in turn to a higher acceleration of the ionised particles of material.

Additionally, an ionizing, lower energy electron beam may be passed through the gas phase of inorganic material, forming a plasma in the process.

BRIEF DESCRIPTION OF THE DRAWINGS

The invention is described in greater detail with the aid of exemplified embodiments shown in the drawings. This shows in.

DETAILED DESCRIPTION OF PREFERRED EMBODIMENTS

Figure 1:
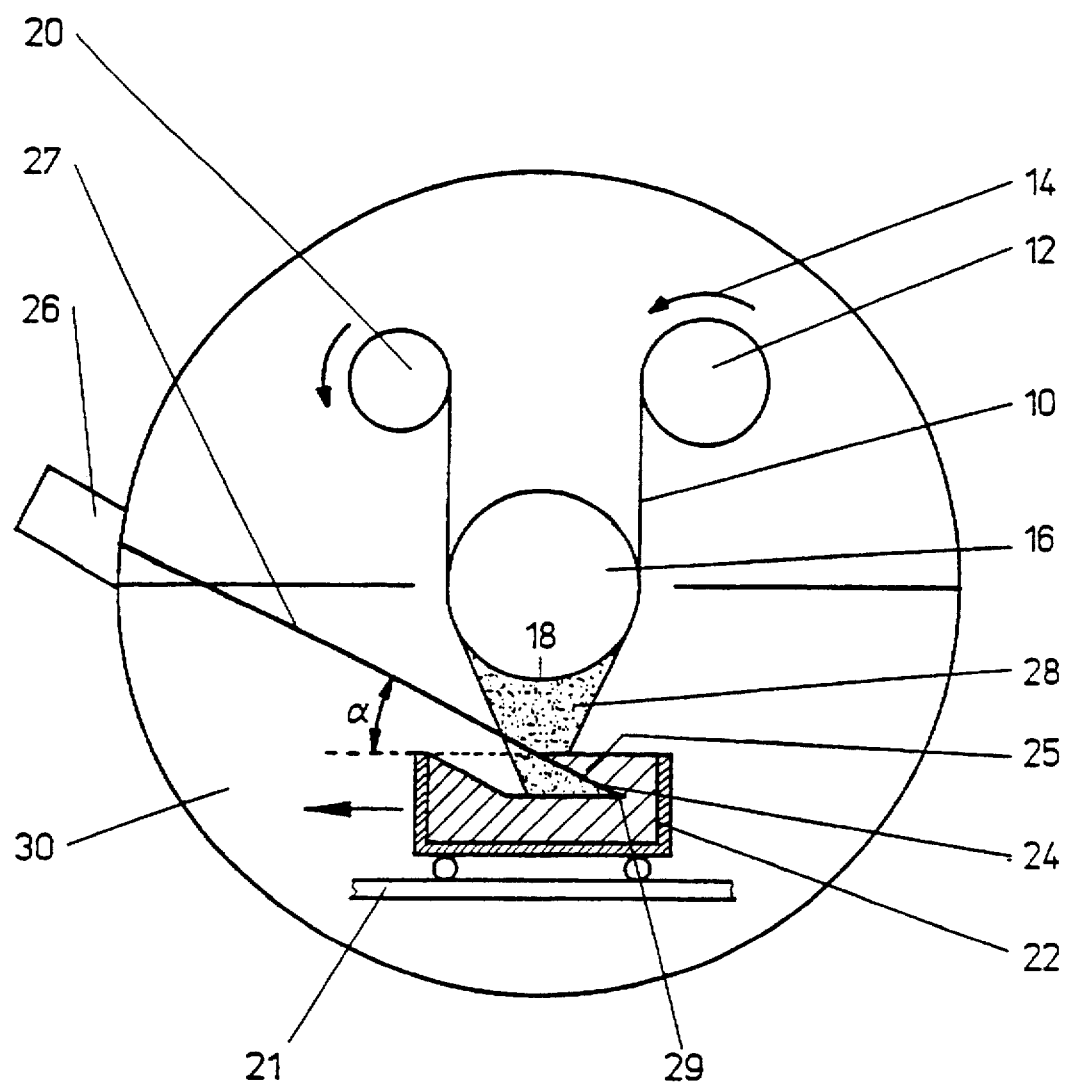
FIG. 1: a sketch showing the principle of a coating device.

The preferred coating source is an electron beam vaporizer in which a crucible is employed having a length (e.g. approx. 1 m to 2.5 m) which is greater than the breadth (e.g. approx. 0.8 m to 2.2 m) of the substrate which is led past the crucible. One or more electron beam guns scan this crucible, the electrons in the electron beam gun experiencing an accelerating voltage of e.g. 5 to 40 kV. The power requirements per running meter of crucible in that case lie in the range of 35 to 100 kW and the deposition rate achieved therewith are at least 0.01 µm/sec, preferably 0.5 to 1 µm/sec. At a substrate transport speed of approx. 200 m/min, this results in an approx. 60 nm thick layer.

The process according to the invention may e.g. be performed on stationary or, in particular, continuously moving substrates.

The substrate surface facing the vaporization crucible may, if desired, first be cleaned then activated with a view to improving the adhesion and durability of the coating.

The cleaning and activating may e.g. be performed by a plasma pre-treatment.

In a continuous process the substrate may be transported on an underlying surface or may run free of any underlying surface and be conducted through the vacuum chamber e.g. at a rate of 1 to 10 m/sec.

Suitable substrates are in particular materials comprised of or containing thermoplastics.

The substrates may be in the form of cast, extruded or film materials e.g. in rolled or sheet form. The materials may be rigid, semi-rigid or flexible. After coating, the materials may e.g. be employed directly as packaging materials or after coating, the substrates may be processed further by applying other layers to it by laminating, cladding or extrusion deposition etc. The vapor deposited layer is preferably protected from mechanical damage by applying a layer on top of it e.g. a film or laminate which is deposited by cladding, extrusion etc.

Film-type materials are e.g. films, laminates, composites or coating materials. The film-type materials may contain or be of thermoplastics e.g. olefin-based, ester-based, polyamide-based or halogen-containing plastics, or polyacetates, polyacrylates, polyacrylic-sulphides, polyacrylic-sulphones, polyacrylic-carbonates, polycarbonates, polyimides, polystyroles or mixtures thereof In particular, the surfaces of the film-type materials to be coated may contain or be of the above mentioned plastics.

The film-type materials may also be made of cellulose containing materials such as paper, pulp sheet, board, paper containing moulded material etc. or may be reinforced by such materials.

The thickness of the individual plastic films in monofilm form or as individual plastic films in composite or laminate form may be e.g. 4 to 2000 µm, preferably 6 to 600 µm and especially 6 to 150 µm.

Composite films or laminates may have conventional layered structures e.g. containing at least two plastic layers, or containing at least one cellulose containing layer and at least one plastic layer.

The film-type materials may also contain a sealing layer e.g. of polyethylene or polypropylene on at least an outer face.

All substrates may be completely clear, cloudy, coloured through their thickness, color printed or printed on.

The composites and laminates, such as described above, may be manufactured in a conventional manner e.g. by coating, extrusion coating, coextrusion coating, cladding, counter cladding or hot calendering.

The various layers and in particular the plastic films or layers may be made into laminates or composites by applying bonding adhesive and/or bonding agents and, if desired, precoating layers.

The coating layer of inorganic materials, deposited on the substrate by vapor deposition of inorganic material made of material such as metals, semiconductors, metallic and/or semiconductor compounds, may exhibit a thickness of e.g. 5 to 500 nm (nanometer), usefully 10 to 200 nm and preferably 40 to 150 nm.

The inorganic materials serving as starting material for the coating are situated in the vaporizing crucible or on a vaporizing crucible. Suitable inorganic materials may at the same time form the vaporizing crucible itself.

The inorganic materials may be a single inorganic substance or two, three or more inorganic materials may be employed beside each other or in mixture form.

A further useful version of the process is such that at least two inorganic materials are vaporized simultaneously in vacuum thus forming a gaseous mixture, or a metal or semiconductor or a mixture of metals or a mixture of semiconductors or a metal/semiconductor mixture and one or more metallic and/or semiconductor compounds may be vaporized.

Preferred inorganic materials are the metals and semiconductors silicon, aluminum, chromium, magnesium, lanthanum, tantalum, boron and zirconium; preferred metallic and semiconductor compounds are the oxides, carbides and nitrides of silicon, aluminum, magnesium, chromium, lanthanum, titanium, boron and zirconium; the inorganic substances may be present in one or more vaporizing crucibles or each substance individually in one or more vaporizing crucibles.

Possible are also processes in which at least two metallic and/or semiconductor compounds are employed, one compound being an oxide of silicon and at least one of the other compounds is an oxide of aluminum, magnesium, lanthanum, titanium, boron or zirconium.

The preferred inorganic materials are a mixture of one or more oxides of silicon, aluminum, magnesium or boron and one or more semiconductors and/or metals such as e.g. boron, silicon, aluminum, zinc, tin and chromium.

The oxides of silicon may have the formula $SiO_x$, where x is a number from 1 to 2. Oxides of aluminum may have the formula $Al_yO_z$ where the ratio y/z is a number from 0.2 to 1.5.

Especially preferred, simultaneously vaporized inorganic materials, are $SiO_2$ and $Al_2O_3$ or $SiO_2$ and $MgO$ or $SiO_2$ and $La_2O_3$ or $SiO_2$ and $TiO_2$ or $SiO_2$ and $ZrO2$ or $SiO_2$ and $B_2O_3$.

In a further preferred version of the process the substrate may be bombarded with $N_2$, Ar or $O_2$ ions while the inorganic materials are being vaporized.

Likewise, the vaporization and deposition may be performed in a reactive atmosphere. The inorganic materials in the vaporizing crucible may be present in the form of solid, tapped, pressed, particulate, compressed, foamed, usefully sintered masses.

The inorganic materials in the vaporizing crucible may be present in a green pressed form having gross density of 25 to 75% of the true density of the inorganic materials in question.

Preferred are gross densities of 40 to 60% and in particular 50% of the true density of the inorganic materials.

Such gross densities are e.g. the apparent densities of powders, grains or fibers loosely or specifically poured into the crucible. If these apparent densities are not reached by free filling, then the powder, grains or fibers may be compacted by tapping until the necessary apparent density is reached. Likewise, pressure may be applied to the powder, grains or fibers until the necessary apparent density is achieved. Pressures of e.g. 1 to 100 $kg/cm^2$, usefully from 40 to 60 $kg/cm^2$ may be applied.

For example such contents for the vaporizing crucible may be prepared by precipitating, crystallizing, grinding, agglomerating or sieving to produce a particle size of 0.05 to 1000 µm. Subsequently, the inorganic materials may be mixed cold and dry, and after mixing and compressing with or without binder such as e.g. polyvinyl alcohol or polyvinyl acetate be placed as compacted charge in a vaporizing crucible.

The compounds may also be manufactured by dissolving or gelling in strong mineral acids, mixing and precipitating e.g. in the sol-gel process, drying and shaping into the vaporizing crucibles.

Other processes for manufacturing the metals, semiconductors, metallic and/or semiconductor compounds constituting the contents of the vaporizing crucible are e.g. isostatic uniaxial pressing, extruding or slurry casting the powder mix in question. The required shape may also be cast, jetted or sprayed.

In order to achieve the desired gross density, especially when it concerns sintering, the substance for vaporizing may be mixed e.g. with organic components which vaporize or burn off during the drying and/or sintering leaving cavities behind or it is possible to sinter particulate or compressed material to the desired density.

Foamed masses are obtainable e.g. by impregnating an organic foam with the material for vaporizing whereby the material in question is made into slurry form, the slurry dried in the organic foam and the organic foam burned off, with the result that the material to be charged to the crucible remains as a copy of the organic foam.

It is also possible to create foamed masses by adding foaming agents to the material.

In order to vaporize the crucible contents, these are heated directly by an electron or laser beam. Depending on the mixture used, the contents vaporize at temperatures of 1100° to 2000° C. In most cases the resultant gas phase has a very different composition from that of the material in the crucible. Consequently, the composition of the layers deposited onto the substrate are very different from the inorganic substances forming the gas phase.

Energy sources such as solid state or molecular lasers may be employed by way of preference to achieve the density of energy required to vaporize the inorganic materials. Particularly suitable are solid state lasers such as neodynimium: YAG lasers or molecular lasers such as the $CO_2$ laser.

The most important molecular laser for processing the material is the $CO_2$ laser which exhibits over 100 wave lengths in the range 9.14 μm to 11.01 μm with a maximum intensity at 10.6 μm. It is characterised by a high degree of efficiency and high energy output in the continuous range. Usefully, a $CO_2$ laser with a power output of 2 to 15 kW is suitable for vaporizing the inorganic material.

The most important solid state laser for technical purposes is the Nd (neodynimium) : YAG laser. YAG is the abbreviation for Yttrium-Aluminum-Garnet ($Y_3Al_5O_{12}$). The most powerful transmission of a Nd: YAG laser takes place at a wave length $\lambda=1.064$ μm. Nd: YAG lasers with a power rating of 0.5 to 3 kW, in particular from 1 to 1.4 kW, are suitable for vaporizing the inorganic material.

Precipitation of the layer from the gas phase occurs on a substrate which is either at ground polarity or is negatively or positively poled with respect to the surroundings. The precipitation occurs in vacuum, as a rule at a reduced pressure lower than $10^{-3}$ mbar. The reactive gas atmosphere may be nitrogen, oxygen, water vapor, hydrocarbons such as acetylene etc.

By means of the reactive atmosphere it is possible to convert the vaporized inorganic materials e.g. metals into their oxides (using oxygen) or their carbides (e.g. using acetylene), or oxides may be converted e.g. to carbides. The composition of the inorganic materials on the substrate may differ from that in the gas atmosphere and in the crucible, depending on the choice of reactive gas and on the rates of vaporization and deposition.

The substrate may be bombarded by ions from an ion source before and/or during and/or after precipitation. The substrate is preferably bombarded with $N_2$, Ar or $O_2$ ions during vaporization.

The present invention relates preferably to an electron or laser gun, the beam of which is directed at the surface of the inorganic material at an angle α of 20° to 70° C., preferably 30° to 60° C.

The vaporizing crucible and the electron or laser gun are to advantage moveable with respect to each other along their longitudinal axes.

In the device according to the invention the direction of movement is such that the vaporizing crucible moves towards the electron or laser beam striking the surface of the inorganic materials at the angle α. The surface of the inorganic materials in the vaporizing crucible advantageously forms a horizontal plane.

The device according to the invention may preferably contain one or more substrates in the vacuum chamber, e.g. in the form of fixed lengths or as endless products in roll form, whereby the endless products are unrolled, coated and coiled again on a second roll. It is also possible to provide two or more vaporizing crucibles in the vacuum chamber, and namely such that the crucibles may contain the same or different inorganic materials. The vacuum chamber may usefully be equipped, as required, with a plurality of electron or laser beam guns.

The present invention also relates to a process for coating a substrate surface with a coating of inorganic materials by vaporizing inorganic materials from a crucible in vacuum, where the crucible and the substrate are situated in a vacuum chamber and an electron or laser beam gun situated in the region of the vacuum chamber emits an electron beam or laser beam onto the inorganic materials in the crucible, causing the inorganic materials to evaporate from the crucible and deposit on the surface of the substrate.

According to the process of the present invention the emitted electron or laser beam strikes the surface of the inorganic materials at an angle α, the angle α enclosed by the incident electron or laser beam striking the surface of the inorganic materials being 10° to 80°, and on vaporizing the inorganic material an overhang forms in the inorganic material and there is no direct geometric line of sight between the point of incidence of the electron or laser beam on the inorganic materials and the substrate.

Preferred is an angle α of 20° to 70°, in particular 30°to 60°.

Preferred is a process according to the present invention in which during vaporization of the inorganic materials the electron or laser beam oscillates sideways across the vaporizing crucible and the crucible and the electron or laser beam are moved at a rate $V_T$ with respect to each other and the rate $V_T$ is a function of the size of the angle α, the rate $V_T$ being expressed by the general formula:

$$V_T = M/(t \times b) \times 1/[\tan(\alpha) \times \Lambda \times \rho]$$

where $\Lambda$ is the overhang in cm, ρ is the apparent density of the inorganic material, M is the mass of the vaporized material, t is the unit of time and b is the width of oscillation of the electron or laser beam in cm. In practice the overhang $\Lambda$ may be 0.5 to 10 cm, usefully 1 to 5 cm, the overhang being so large that there is no direct geometric line of sight between the point of incidence of the electron or laser beam and the substrate. The apparent density i.e. the material density or the bulk density ρ may be 0.6 to 3.0 g/cm³, usefully 0.8 to 1.6/cm³ and preferably 0.9 to 1.2/cm³. The range of oscillation or width of scan of the electron or laser beam may e.g. be 10 to 300 cm.

On carrying out the present process the vaporizing crucible and the electron or laser beam move relative to each other during the vaporizing of the inorganic materials. This may mean that the vaporizing crucible is moved along its longitudinal axis below a stationary electron or laser beam, or that the electron or laser beam is moved along the longitudinal axis of the vaporizing crucible, or that the electron or laser beam is moved around an axis of rotation, or a combination of two or all modes may be employed. The first mode viz., the movement of the crucible alone is preferred. Particularly preferred is for the crucible to be moved towards the electron or laser beam striking it at an acute angle α. As a rule, during the process, the electron or laser beam swings sideways in an oscillating manner and the crucible moves relative to the electron or laser beam. Consequently the whole surface of the crucible, and therefore that of the inorganic material, is scanned, i.e. impinged by the electron or laser beam and therefore the inorganic material vaporized off. The crucible may be moved e.g. by mechanical, hydraulic, pneumatic or electromagnetic means.

The overhang of organic materials represents the set condition, in particular during the continuous, stable run of the process.

According to the version shown in FIG. 1, a plastic film 10 representing the substrate is uncoiled from a roll 12 in a vacuum chamber 30 (the evacuation equipment is not shown here); it is uncoiled in the direction of the arrow 14 and drawn over a roll 16. The plastic film 10 lying on the roll 16 which acts as substrate support forms the substrate area 18 in the process. After being coated, the plastic film 10 is coiled onto another roll 20. For simplification purposes, any deflection rolls involved are not shown here.

In a vaporizing crucible 22 is the inorganic material 24 which is to be vaporized and which is heated in the impingement zone 29 by a scanning high voltage electron beam gun 26. The energy of the electron beam 27 causes a gas phase 28 of inorganic material 24 to be formed. As a result of the vaporization of inorganic material 24 and the movement of the crucible 22 with respect to the electron beam 27, a steadily advancing overhang 25 is formed.

Figure 2:
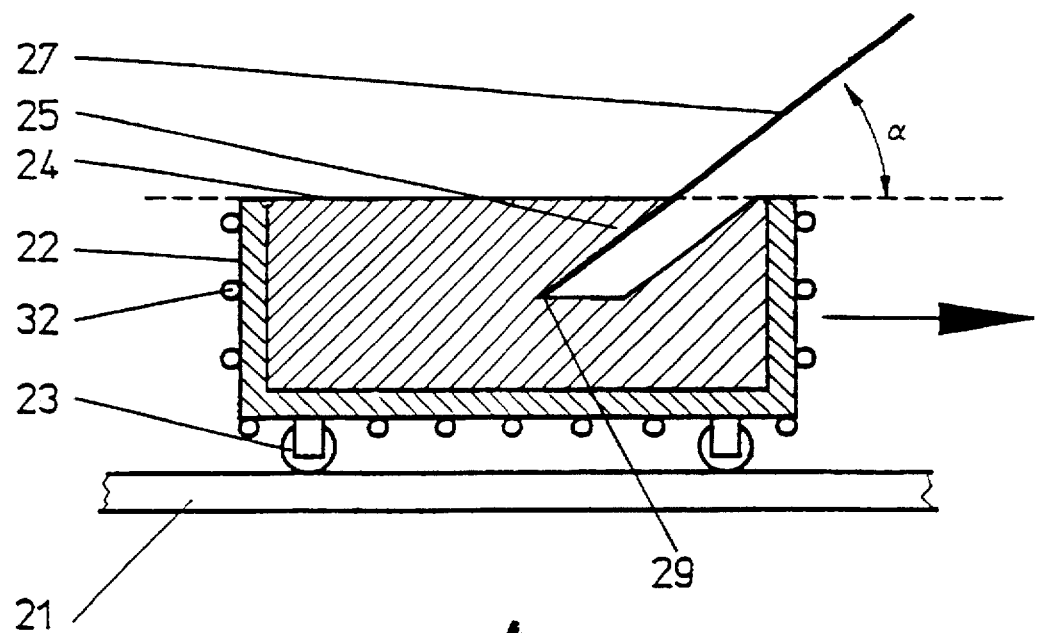
FIG. 2: a sketch showing the vaporizing crucible in FIG. 1 in detail.

FIG. 2 shows a detailed sketch of the device in FIG. 1.

The crucible 22 comprising bottom and sidewalls is, by way of example, provided here with a cooling device in the form of a cooling coil 32. A fluid such as e.g. water or brine may circulate in the cooling coil. In many cases it is adequate to cool the radiated heat especially when the inorganic material is a poor thermal conductor, in this case because the inorganic material is heated only locally in the region of impingement of the electron beam. The crucible 22 runs on rolls 23 and may be moved by a drive mechanism. The rolls 23 rest on a base 21 which is situated inside the vacuum chamber 30. Instead of rolls one may employ sliding pins, sliding stones, runners, rollers, ball bearings, wheels etc.

The crucible 22 is filled with inorganic material 24. Depending on the form of inorganic material 24 used i.e. for example as loose material or as solid material, the crucible 22 may have the form of a platform, trough, tank or dish. The electron beam 27 or laser beam 27 strikes the surface of the inorganic material 24 at an angle α of 10° to 80°. This means that the electron beam, or the laser beam, strikes the surface of the inorganic material 24 at an acute angle α. The surface of the inorganic material is essentially a flat surface. The moveable crucible 22 may be moved away from the electron beam i.e. forwards or towards the electron beam i.e. backwards, the backwards movement indicated by the arrow being preferred.

The preferred direction of movement of the crucible 22 is also shown in FIG. 1 by an arrow. Instead of moving the crucible the electron or laser beam gun may be moved forwards or backwards by displacing the electron or laser beam gun. These modes of movement may also be combined. The crucible 22 may be displaced on a horizontal plane, it is however also possible to move the crucible along a slope or along a curve.

The described arrangement and direction of movement causes an overhang 25 of inorganic material to be formed. This overhang 25 is reduced on its underside by the essentially continuous movement of the crucible counter to the direction of the beam and at the same time re-forms there so that a state of equilibrium is achieved. The overhang 25 blocks off a direct or geometric line between the vaporizing zone and the substrate. This, together with the uniform supply of material into the vaporizing zone due to the described arrangement leads, surprisingly, to particularly homogeneous vaporization and to layers with very much reduced incidence of defects. In turn this permits more intensive vaporization than conventional processes.

Figure 3:
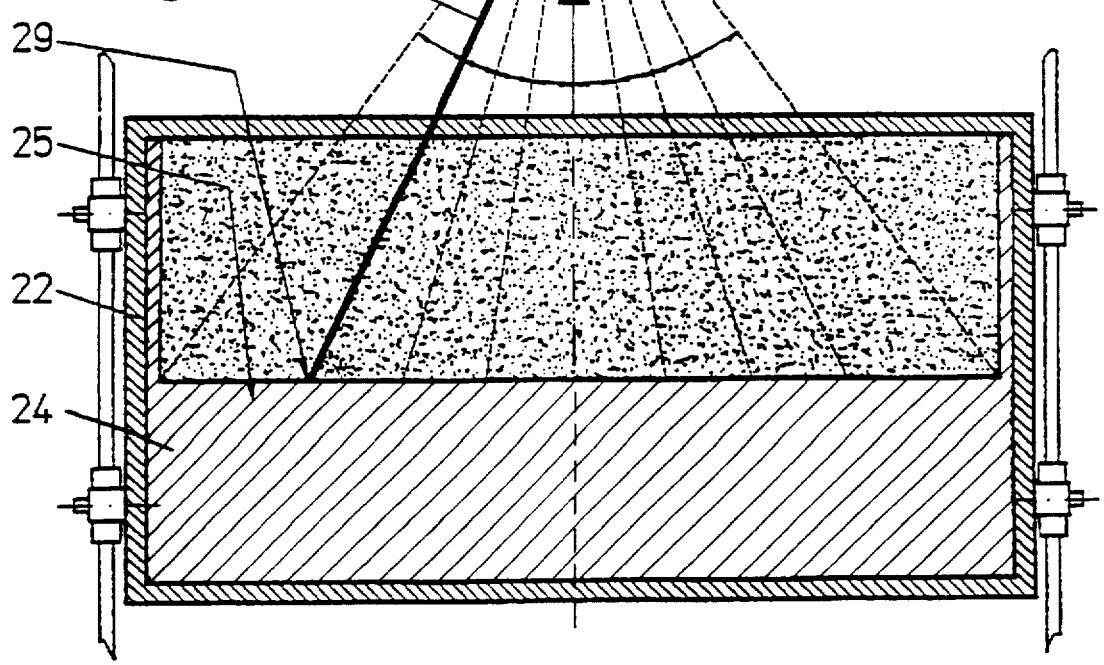
FIG. 3: a plan view of the vaporizing crucible.

FIG. 3 shows a plan view of a crucible 22. The crucible 22 is by way of example in the form of a rectangular tank. In another version the crucible could be a slab on which the inorganic material is situated. The crucible can be moved in an axial direction, the preferred direction of movement being indicated by an arrow. The electron or laser beam 27 emitted by the electron beam gun or a high powered laser (not shown) is swung in an oscillating manner and the organic material 24 melted and vaporized or sublimated along a linear impingement zone 29. The swinging action takes place in an oscillating manner and with a frequency of e.g. at least 5 Hz, preferably at least 30 Hz. This linear impingement zone 29 of the beam 27 lies approximately perpendicular to the direction of movement of the crucible containing the inorganic material 24. As the crucible is steadily advanced the inorganic material is successively removed over the whole length and breadth of the crucible.

The substrates coated by the described method and device are suitable e.g. for use as packaging materials or packing material or for manufacturing packaging materials or packing materials such as packaging films or laminates. For example packaging materials and packing materials may be produced with the inorganic coating or covering free of or low in defects and exhibiting no inhomogenieties such as particulate inclusions, deposits and sprayed inorganic material. From these packaging materials one may then produce containers for packaging purposes such as pouches, sachets, wraps, bags, dish-shaped containers, deep-freeze packs, menu dishes and the like, or lidding materials may be manufactured for deep-freeze packs or dish-shaped containers. Such containers are suitable for holding foodstuffs for animal or human consumption or for luxury and semi-luxury items in solid to liquid form. Further areas of application for the packaging material are packaging for pharmaceutics and medicines such as tablet packs and blister packs.

We claim:

1. Device, which comprises: a vacuum chamber; a substrate having a substrate surface and said substrate surface being situated in said vacuum chamber; a vaporization crucible filled with inorganic materials having a surface thereof and situated in said vacuum chamber; and, in the region of the vacuum chamber, an electron beam or laser gun whose beam is directed at the crucible, said device being for coating said substrate surface with a coating of inorganic materials by vaporizing the inorganic materials; wherein the electron or laser beam of the electron beam or laser gun is directed at the surface of the inorganic materials in the vaporizing crucible, and the electron or laser beam forms an angle α of 10° to 80° to the surface of the inorganic materials, wherein an overhang is present in the inorganic materials, and, geometrically, there is no line of sight between the vaporizing inorganic materials and the substrate surface.

2. Device according to claim 1, wherein the angle α is 20° to 70°.

3. Device according to claim 2, wherein the angle α is 30° to 60°.

4. Device according to claim 1, wherein the vaporizing crucible and the electron beam or laser beam gun move, with respect to their longitudinal axes, relative to each other.

5. Device according to claim 1, wherein the vaporizing crucible is movable towards the electron or laser beam striking the surface of the inorganic materials at the angle α.

6. Device according to claim 1, wherein the electron or laser beam is movable sideways, in an oscillating manner, with respect to the longitudinal axis of the vaporizing crucible.

7. Device according to claim 1, wherein the surface of the inorganic materials in the vaporizing crucible forms a horizontal plane.

8. Process which comprises: coating a substrate surface with a coating of inorganic materials by vaporizing inorganic materials from a crucible in vacuum, where the crucible and the substrate surface are situated in a vacuum chamber and an electron or laser beam gun situated in the region of the vacuum chamber emits an electron beam or laser beam onto the inorganic materials in the crucible, causing the inorganic materials to evaporate from the crucible and deposit on the surface of the substrate, wherein the emitted electron or laser beam strikes the surface of the inorganic materials at an angle α, the angle α enclosed by the incident electron or laser beam striking the surface of the inorganic materials being 10° to 80° and wherein an overhang is present in the inorganic material and there is no direct geometric line of sight between the point of incidence of the electron or laser beam on the inorganic materials and the substrate.

9. Process according to claim 8, wherein the angle α is 20° to 70°.

10. Process according to claim 9, wherein the angle α is 30° to 60°.

11. Process according to claim 8, wherein, during the vaporization of the inorganic materials, the vaporizing crucible and the electron beam or laser beam gun move, with respect to their longitudinal axes, relative to each other.

12. Process according to claim 8, wherein, during the vaporization of the inorganic materials, the vaporizing crucible is moved towards the electron or laser beam striking the surface of the inorganic materials at the angle α.

13. Process according to claim 8, wherein, during the vaporization of the inorganic materials, the electron or laser beam is moved sideways, in an oscillating manner, with respect to the longitudinal axis of the vaporizing crucible.

14. Process according to claim 8, wherein, during the vaporization of the inorganic materials, the electron or laser beam oscillates sideways across the vaporizing crucible, and the crucible and the electron or laser beam are moved at a rate $V_T$ with respect to each other and the rate $V_T$ is a function of the size of the angle α, the rate $V_T$ being expressed by the general formula:

$$V_T = M/(t \times b) \times 1/[\tan(\alpha) \times \Lambda \rho]$$

where $\Lambda$ is the overhang in cm, $\rho$ is the apparent density of the inorganic material, M is the mass of the vaporized material, t is the unit of time and b is the width of oscillation of the electron or laser beam in cm.

15. Process according to claim 8, wherein the surface of the inorganic material forms a horizontal plane and the inorganic materials are removed by vaporizing.

* * * * *